(12) United States Patent
Kim (10) Patent No.: US 11,903,178 B2
(45) Date of Patent: Feb. 13, 2024

(54) SYSTEM FOR REDUCING SPECIFIC ABSORPTION RATE

(71) Applicant: UNITECH CO., LTD., Seoul (KR)

(72) Inventor: Chang Ho Kim, Goyang-si (KR)

(73) Assignee: UNITECH CO., LTD., Seoul (KR)

( * ) Notice: Subject to any disclaimer, the term of this patent is extended or adjusted under 35 U.S.C. 154(b) by 283 days.

(21) Appl. No.: 17/522,386

(22) Filed: Nov. 9, 2021

(65) Prior Publication Data

US 2022/0117124 A1   Apr. 14, 2022

Related U.S. Application Data

(63) Continuation of application No. PCT/KR2021/008419, filed on Jul. 2, 2021.

(30) Foreign Application Priority Data

Jul. 16, 2020  (KR) .................. 10-2020-0088160

(51) Int. Cl.
*H05K 9/00* (2006.01)

(52) U.S. Cl.
CPC ................ *H05K 9/0071* (2013.01)

(58) Field of Classification Search
CPC .. H05K 9/0071; H05K 1/0216; H05K 1/0233; H05K 9/0022; H01F 27/36; H01F 27/363; H01F 38/14; H01F 27/34; H01F 27/2804; H02J 50/50; H02J 50/70; H04B 5/0037
USPC ...................................... 361/152
See application file for complete search history.

(56) References Cited

U.S. PATENT DOCUMENTS

| | | | |
|---|---|---|---|
| 10,103,777 B1 * | 10/2018 | Henry | H04B 3/52 |
| 2018/0097401 A1 * | 4/2018 | Gaskill | H02J 7/0042 |
| 2018/0166920 A1 * | 6/2018 | Britz | H02J 7/00045 |
| 2019/0181683 A1 * | 6/2019 | Vannucci | H02J 50/70 |
| 2019/0305592 A1 * | 10/2019 | Vannucci | H01P 3/16 |

FOREIGN PATENT DOCUMENTS

| | | |
|---|---|---|
| JP | P2018-181974 A | 11/2018 |
| JP | P2019-102665 A | 6/2019 |
| KR | 10-2001-0004862 A | 1/2001 |
| KR | 10-2004-0045160 A | 6/2004 |
| KR | 10-2018-0105628 A | 9/2018 |

* cited by examiner

*Primary Examiner* — Dharti H Patel
(74) *Attorney, Agent, or Firm* — United One Law Group LLC; Kongsik Kim; Jhongwoo Peck (57) ABSTRACT

A system for reducing a specific absorption rate includes a source field generation unit wound with a first cylindrical coil and accommodating a source material therein, and generating a source field by applying a periodic input signal to the first cylindrical coil; a physical property change unit wound with a second cylindrical coil disposed adjacent to the first cylindrical coil and accommodating a transfer target therein, and changing a physical property of the transfer target based on the generated source field; and a target field circuit unit controlling the transfer target to form a target field by a PCB substrate with a power supply interface connected to a power supply and an input of the power supply.

5 Claims, 6 Drawing Sheets

Beetamin (for smart phone)

| Classification | Before using Beetamin | After using Beetamin | Result | Remarks |
|---|---|---|---|---|
| Domestic specific absorption rate (SAR) Press Testing Laboratory | 0.411(W/kg) | 0.268(W/kg) | -73.1% | reduction of high SAR |
| Overseas specific absorption rate (SAR) Complementary and Alternative Medicine Testing Lab | 0.489(W/kg) | 0.089(W/kg) | -81.8% | |
| Stress index | 50 | 26 | -24 | -48% Drop |
| Change in body temperature | 37°C | 36.5°C | -0.5°C | Maintenance of normal body temperature |
| Brain wave test (Institute of Complementary Alternative Medicine in Seoul National University College of Medicine) | α Waves, β Waves: 45%, θ Waves: 55% | α Waves, β Waves: 66%, θ Waves: 34% | α Waves, β Waves: +21% | improved concentration and attention |
| Heating of smart phone | 28.8°C | 27.6°C | -1.2°C | drop of smart phone temperature |
| Subjective fatigue (Korea Research Institute of Standards and Science) | (5.1) (5.8) (5.8) (6.0) 22.7 | (5.0) (5.3) (4.8) (5.0) (2%) (8.7%) (17%) (5%) 20.8 | -8.4% | Reduction and mitigation of stress |

FIG. 6 tpowerU (for computer)

| Classification | Before using tpowerU | After using tpowerU | Note |
|---|---|---|---|
| Eye dryness & VDT syndrome (Bokyung University) | Light of light emission products evaporates tears and insoluble filtering of tears eyes is reduced | Improved stability of tears (TBU) (increase in secretion of tears (%)) | Reduction of eye dryness |
| Computer WiFi specific absorption rate (SAR) (Korea Testing Laboratory) | ▲ 2.4GHz<br>▲ 5.2GHz → 1.76(W/kg) | 2.4GHz → 0.83(W/kg) 33.6% Decrease<br>▲ 5.2GHz → 1.17(W/kg) 33.4% Decrease | Reduced by about 33% of SAR |
| (KES) | POWER IC A: 72.7°C | POWER IC A: 70.3°C | -2.1°C ~ -2.4°C |
| EEG, ECG, EMG, Body temperature (Korea Testing Laboratory) | CPU related power IC : 62.1°C | CPU related power IC : 60.0°C | Decrease in temperature |
| | | | Improved stability, improved computing ability |
| | | 28.2% | Improved |
| | 100% | | | ts
SYSTEM FOR REDUCING SPECIFIC ABSORPTION RATE

CROSS-REFERENCE TO RELATED APPLICATIONS

This application is a Continuation of PCT/KR2021/008419 filed on Jul. 2, 2021, which claims priority to Korean Application No. 10-2020-0088160 filed on Jul. 16, 2020. The aforementioned applications are incorporated herein by reference in their entireties.

BACKGROUND

1. Technical Field

The present disclosure relates to a system for reducing a specific absorption rate of an electromagnetic wave.

2. Description of the Related Art

It has become routine for people in modern society to live in the environment where they are exposed to unwanted electromagnetic waves generated from many electrical and electronic products. In particular, televisions, computers, and smart phones have become necessities that are inseparable in everyday life, and the attention to electromagnetic waves emitted from the products is higher than ever. Especially, since more products are designed to embed wireless communication functionality, people are more exposed to a radio frequency (Wi-Fi) environment for a long time, and with the introduction of 5G mobile communication technology, the health of modern people has been dangerously affected by high electromagnetic wave intensity due to high frequency (3.5 GHz to 28 GHz) 5G mobile services.

In relation to harmful adverse effects of electromagnetic waves on human body or vivo tissues, the International Agency Research on Cancer (IARC) classifies a cancer generation grade of mobile phone electromagnetic waves (RF) as 2B, and announces that there may be generally a heat action, a non-heat action, and a simulation action as another influence which the electromagnetic waves may exert on human body. Here, the heat action refers to a case where when the human body is exposed to electromagnetic waves having a high frequency and a high strength, a body temperature is raised and the electromagnetic waves influence a function of a cell or an organ, and the non-heat action is generated when the human body is exposed to a weak electromagnetic wave for a long time. In addition, the stimulation action refers to a case where current induced to the human body stimulates a nerve or a muscle when the human body is exposed to electromagnetic waves having a low frequency and the large strength.

As a method for reducing an absorption rate of the electromagnetic waves in the related art, Korean Patent Unexamined Application No. 10-2004-0076737 discloses an application method for reducing a specific absorption rate (SAR) by optimizing a distribution pattern of an EMI paint applied to a front case in a mobile phone, and Korean Patent Registration No. 10-1229058 discloses a method for shielding an electromagnetic wave of a cellular phone, by attaching a copper plated layer or a graphene layer for electromagnetic wave shielding and heat dissipation to a rear surface of the cellular phone to fully absorb or negate the electromagnetic waves generated from the cellular phone when in operation.

As a measure of the heating is the specific absorption rate (SAR) which has units of watts per kilogram (W/kg) at which a human body or vivo tissue per unit mass absorbs the electromagnetic wave. When the SAR is high, the high SAR may exert a bad effect on the human body or vivo tissue, and as a result, many national governments regulate the limit of the SAR for the human body not to exceed the standard value established for its own country.

Aforementioned electromagnetic wave absorption rate reducing devices may show some effect, however, as the operation mechanism thereof is focused on shielding or absorption, there is a disadvantage in that an electromagnetic wave reducing component becomes larger in proportion to a size of an electronic product, and there are many difficulties in applying the electromagnetic wave reducing component to the electronic product. Furthermore, a limit in that the electromagnetic wave absorption rate reducing devices may decrease an electromagnetic wave signal or cellular calling sensitivity is emerging as prohibitive for its adoption.

Therefore, there is a need for a study of a new form of electromagnetic absorption rate reduction system that can present a fundamental solution that can reduce the harmful effects of electromagnetic waves.

SUMMARY

An object of the invention is to provide a system that reduces a specific absorption rate. This is enabled by inducing a change in physical property through the use of the characteristic of a longitudinal wave of an electromagnetic wave to a target material, then by applying the transfer target that has change induced physical property to a printed circuit board.

Another object of the present invention is to provide a device that reduces a specific absorption rate that can be easily and widely applied to the various electronic product regardless of its size and types. This is possible by applying the transfer target, which is electrically connected to or embedded in the printed circuit board and uses the power source of the electronic product, to a printed circuit board of the electronic product.

An exemplary embodiment of the present disclosure provides a system for reducing a specific absorption rate, which includes: a source field generation unit wound with a first cylindrical coil and accommodating a source material therein, and generating a source field by applying a periodic input signal to the first cylindrical coil; a physical property change unit wound with a second cylindrical coil disposed adjacent to the first cylindrical coil and accommodating a transfer target therein, and changing a physical property of the transfer target based on the generated source field; and a target field circuit unit controlling a PCB substrate with a power supply interface connected to a power supply and the transfer target as an input of the power supply to form a target field.

The source field generation unit may further include a flat type first spiral coil disposed on a side surface of the first cylindrical coil, the physical property change unit may further include a flat type second spiral coil disposed on a side surface of the second cylindrical coil, and the flat type first and second spiral coils may be inter-connected.

Further, the source material may be a crystalline material and the transfer target may be a thin-film type metal.

Meanwhile, the source field may include a longitudinal wave, and the system for reducing a specific absorption rate may further include a frequency generator for generating the periodic input signal, and the periodic input signal may be a frequency which matches a unique frequency of the source material.

According to the embodiment of the present disclosure, it is possible to induce a change in physical property by using a characteristic of a longitudinal wave of an electromagnetic wave in a target material and to reduce a specific absorption rate by applying a transfer target with the induced change in physical property to a printed circuit board.

Further, it is possible to be easily usable regardless of sizes and types of electronic products by being electrically connected or embedded in electronic products by applying a transfer target to a printed circuit board and to be easily applied by using a power device of an electronic product.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION

Hereinafter, embodiments of the present disclosure will be described in detail with reference to the accompanying drawings and the contents disclosed in the accompanying drawings, but the present disclosure is not limited or restricted to the embodiments.

Various modifications may be made to embodiments to be described below. Embodiments to be described below are not intended to be limited to the aspects and should be understood to include all modifications, equivalents, and substitutes thereof.

Meanwhile, in describing the present disclosure, detailed description of associated known function or constitutions will be omitted if it is determined that they unnecessarily make the gist of the present disclosure unclear. Terminologies used herein are terminologies used to properly express embodiments of the present disclosure, which may vary according to a user, an operator's intention, or customs in the art to which the present disclosure pertains. Accordingly, definitions of the terminologies need to be described based on contents throughout this specification.

In addition, in the description with reference to the accompanying drawings, like components regardless of drawing numerals are designated with like reference numerals and a duplicated description thereof will be omitted. In describing the embodiments, a detailed description of related known technologies will be omitted if it is determined that they unnecessarily make the gist of the embodiments unclear.

System for Reducing Specific Absorption Rate

Figure 1:
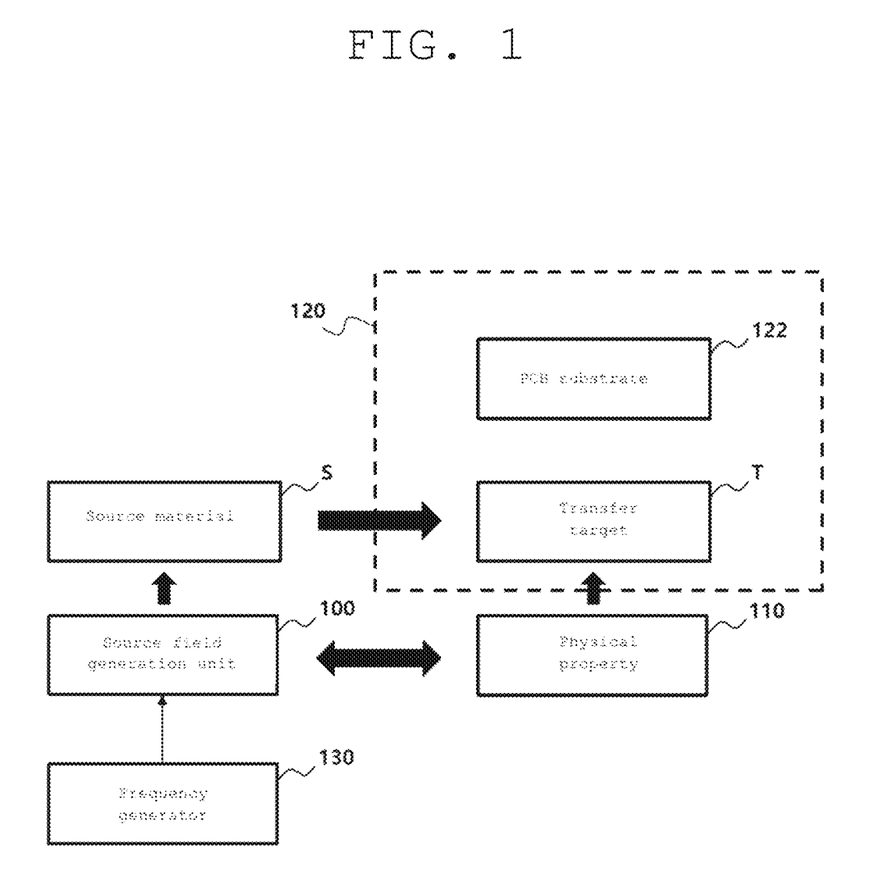
FIG. 1 is a configuration diagram illustrating a configuration of a system for reducing a specific absorption rate of the present disclosure.

FIG. 1 is a configuration diagram illustrating a configuration of a system for reducing a specific absorption rate of the present disclosure. As illustrated in FIG. 1, an embodiment of the system for reducing the specific absorption rate may be configured to include a source field generation unit 100, a physical property change unit 110, and a target field circuit unit 120.

The system for reducing the specific absorption rate may be largely divided into a change effect in physical properties of a transfer target and an effect from the application of the transfer target with the changed physical property, and may be seen (or regarded) as one system that includes a process of a method for reducing the specific absorption rate.

In relation to the changes in physical properties of the transfer target, it is necessary to understand the concept of the longitudinal wave in the historical aspect of the modern and present science. Maxwell, which established the basis of electronic technology, first proposed 20 equations, and after about 20 years therefrom, Oliver Heaviside completed a Maxwell equation (or Maxwell-Heaviside Equation) by removing longitudinal electric wave and electric potential terms and using an equation of an electric field E and an equation of a magnetic field B in a process of integrating and summarizing the 20 equations to four equations. Those are Gauss's law, Gauss's law for magnetism, Faraday's law, and Ampere's Law.

However, the Maxwell equation has been inevitable to a lot of challenges today, even though it is a demonstrative theory that became the foundation of the modern science. A professor, Constantin Meyl of Germany pointed out that since many of foundational equations of the modern electronic technology are omitted and organized, the equation is a less universal equation used only in a certain circumstance. As the extension thereof, the professor, Constantin Meyl has also pointed out that the electromagnetic wave propagating a space has a longitudinal wave in addition to the transverse wave.

In other words, the electromagnetic wave has a transverse wave of Hertz and a longitudinal wave of Tesla, and specifically, those are electromagnetic wave (transverse wave) of Hertz, an electric scalar wave (longitudinal wave) presented by Tesla, and a magnetic scalar wave (longitudinal wave) presented by Constantin Meyl. The longitudinal wave means that one of the electric field or the magnetic field is formed in the same progressing direction. For example, an antenna forming an electric dipole emits electromagnetic waves including a longitudinal wave component, which is referred to as a field vortex. Furthermore, in a situation where the electromagnetic waves are emitted, a longitudinal wave may be formed in a near field form within a half wavelength or a wavelength.

Hereinafter, a configuration of the embodiment will be described with reference to FIGS. 2 to 4.

Figure 2:
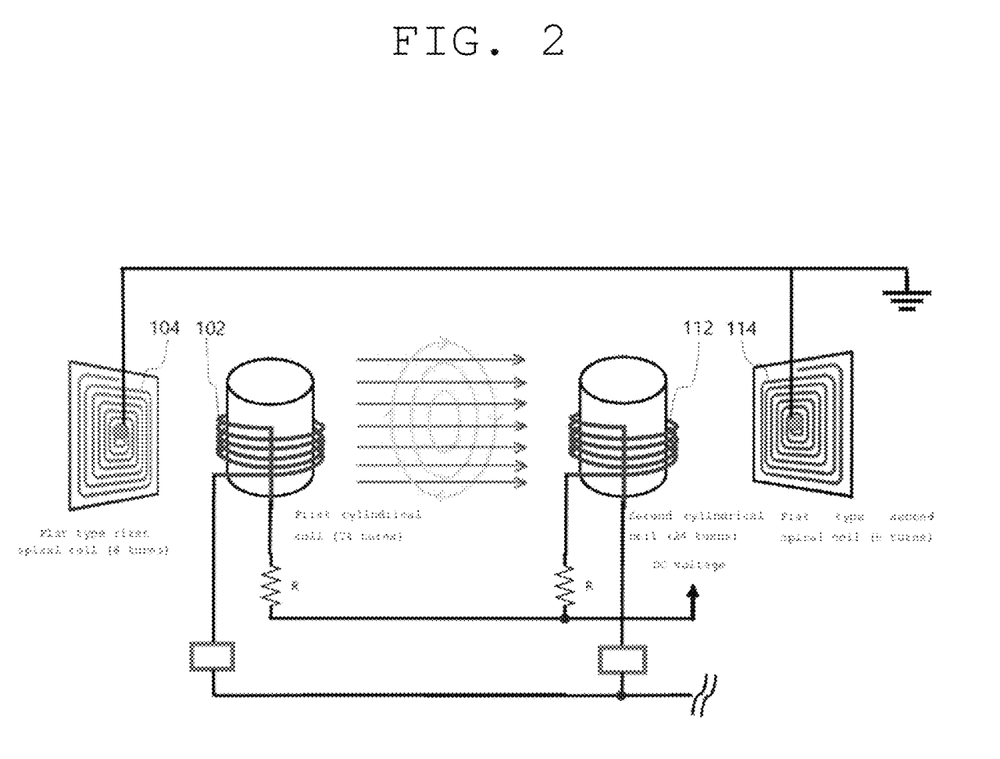
FIG. 2 is a diagram schematically illustrating a configuration of a source field generation unit and a physical property change unit in configurations of the system for reducing a specific absorption rate of the present disclosure.

The source field generation unit 100 is wound with a first cylindrical coil 102 as illustrated in FIG. 2 and accommodates a source material therein, and serves to generate a source field by applying a periodic input signal to the first cylindrical coil 102. That is, the source field generation unit 100 emits characteristic information of the source material in a source field form by using the periodic input signal as a carrier wave. The source field may also serve to change physical properties including spins of electrons of a specific transfer target. Such a source field generation unit 100 is configured to be connected with a frequency generator 130 for generating the periodic input signal.

First and second spiral coils 104 and 114 may be further disposed on the respective sides of the first and second cylindrical coils 102 and 112, and the first and second spiral coils 104 and 114 may also be planar windings or stereoscopic windings. In this embodiment, the first and second spiral coils 104 and 114 have been formed as a flat type as the planar windings, the shape of each of the first and second spiral coils 104 and 114 has a spiral shape as illustrated in FIG. 2, and the first and second spiral coils 104 and 114 are disposed so that the wound planes face each other on the respective sides of the first and second cylindrical coils 102 and 112. In addition, a source material is disposed in a hollow of the first cylindrical coil 102 and a target material is disposed in a hollow of the second cylindrical coil 112.

Figure 3:
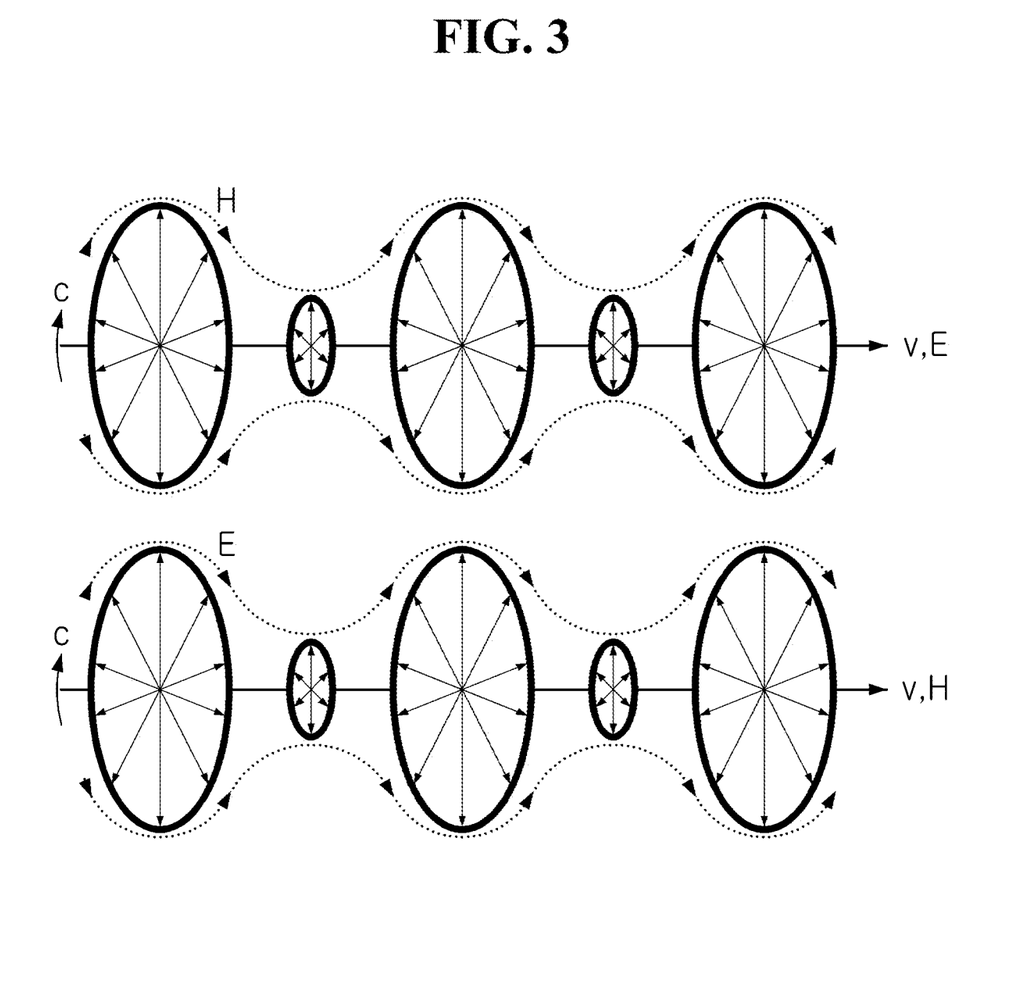
FIG. 3 is a diagram schematically illustrating an electric wave (upper part) and a magnetic wave (lower part) used in the system for reducing a specific absorption rate of the present disclosure.

The source field may appear in the form of an electric scalar wave (longitudinal wave) or a magnetic scalar wave (longitudinal wave), as shown in FIG. 3.

The source material is preferably selected with a material with which a natural frequency may be resonated in response to a frequency of the periodic input signal. As an example, a crystalline material having a specific natural frequency such as quartz may be used as the source material, and the input signal may use a square wave periodic signal. However, the square wave may be replaced with a signal having a sine wave.

The physical property change unit 110 is wound with the second cylindrical coil 112 disposed adjacent to the first cylindrical coil 102 and accommodates the target material therein, and serves to change the physical properties of the transfer target based on the generated source field. That is, the second cylindrical coil 112 may form an electric field and a magnetic field that are induced from the influence of the source field and the physical properties of the transfer target may be changed based on the induced electric field and magnetic field. In the induced electric field and magnetic field herein, the transfer target may be configured by a thin film made of plated gold or other materials.

As illustrated in FIG. 2, the first cylindrical coil 102 and the second cylindrical coil 112 may be configured so that a pair of hollow cylindrical coils are disposed to face each other and a flat type of first spiral coil 104 and a flat type of second spiral coil 114 are disposed on sides of the first cylindrical coil 102 and the second cylindrical coil 112, respectively, so that capacitive transmission may occur.

Meanwhile, although not illustrated in FIG. 2, the flat type of first spiral coil 104 and the flat type of second spiral coil 114 are electrically connected to each other and may be connected to each other by further including a flat type of noise offset coil therebetween. The noise offset coil may be configured so that a flat type of quadrangular coil is repeated several turns.

Each of the first cylindrical coil 102 and the second cylindrical coil 112 is connected to the frequency generator 130 and a time controller (not illustrated) to input a specific signal selected from frequencies of several Hz to thousands of Hz within a predetermined time.

In particular, it is preferable that the periodic input signals input to the first cylindrical coil 102 and the second cylindrical coil 112 are alternately input. That is, if the TX coil 102 is high, the RX coil 112 is input to low and if the TX coil 102 is low, the RX coil 112 is input to high. The sine wave is input by varying 180° phase.

Figure 4:
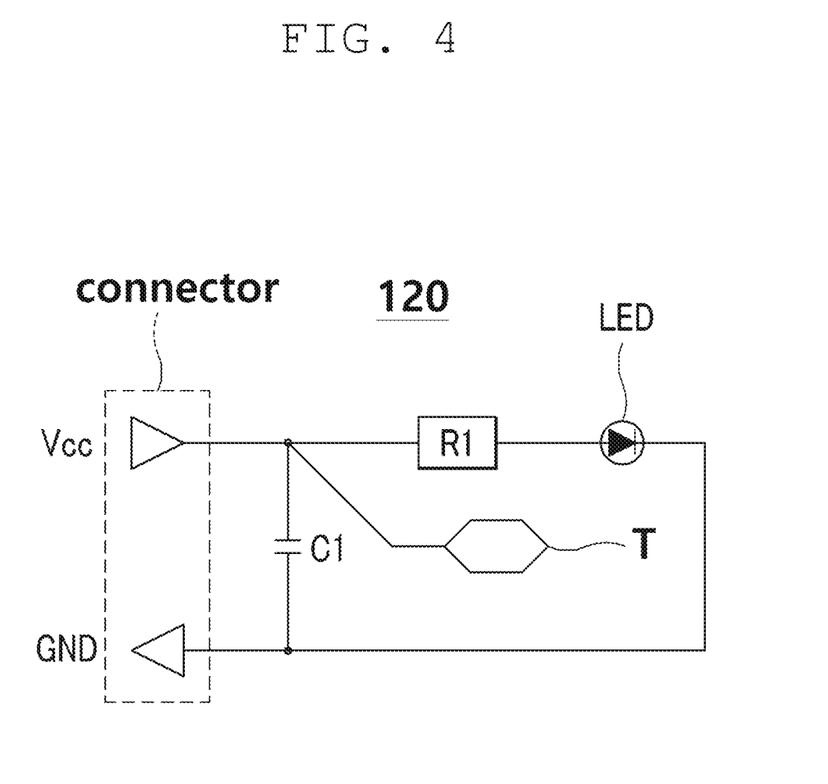
FIG. 4 is a diagram illustrating a configuration of a target field circuit unit in the configuration of the system for reducing a specific absorption rate of the present disclosure.

The transfer target in which the physical properties are changed by a physical property change mechanism of the source field generation unit 100 and the physical property change unit 110 may be configured as a target field circuit unit 120 on a PCB substrate including a resistor R1 and a capacitor C1 as illustrated in FIG. 4.

The target field circuit unit 120 may be formed with a connector as a power interface connected with a power source and serves to control the transfer target to form a target field based on the input of the power source.

When the target field circuit unit 120 is connected to an I/O connector of a mobile phone, the LED is turned on by the battery power source through resistor R1, and the transfer target T generates a signal for reducing the specific absorption rate. On the other hand, the target field circuit unit 120 may be designed and implemented on the main board of an electronic product.

The target field generated by the transfer target is determined to be related with the quality of the electromagnetic waves which have been mentioned and experimented by Kozyrev of Russia. That is, the Kozyrev has studies charges and spins of electrons and electromagnetic waves generated according to changes in charges and spins, but derived a theory by conceiving that in modern physics, the study of quality of physical values was absent other than the measurement of physical values such as intensity, frequency or wavelength.

Kozyrev has mentioned that when the spins of the electrons of the material are changed, a phenomenon of causing entropy changes along with electromagnetic waves concurrently occurs, and the entropy change may cause a local change of time and an effect on the material. As a result, the target field is determined to have a specific absorption rate reduction effect, a biofunction activation effect, with the change of entropy.

On the other hand, this embodiment is not a system that weakens or shields electromagnetic waves like the prior art. The target field serves to generate waves having a beneficial effect on a human or living body to offset a harmful adverse effect of electromagnetic waves, through the transfer of beneficial information using a longitudinal wave of electronic waves. This beneficial information may be information that interacts with a human biofield field, such as in torn leaf experiment of Kirlian Photography.

In addition, in the embodiment, the characteristics of the target field have a longitudinal wave characteristic and may have a beneficial impact of reducing the specific absorption rate. In particular, when the target field is formed by being connected to an electronic device such as a mobile phone, an environment in which the longitudinal wave characteristic of the target field may be largely affected.

Figure 5:
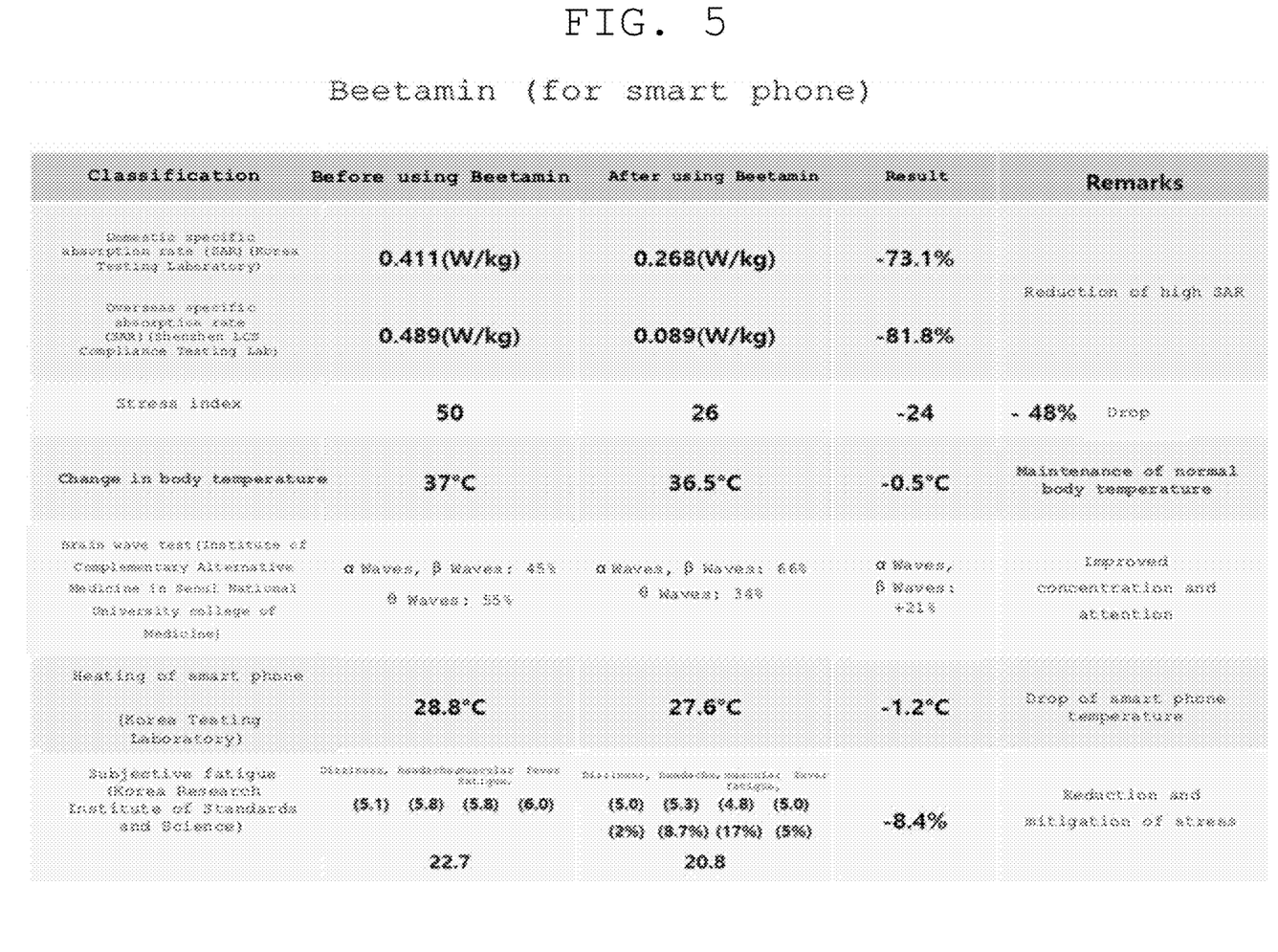
FIGS. 5 and 6 are data tables illustrating test result values for connector type and USB type devices to which a configuration of a target field circuit unit of the configurations of the system for reducing a specific absorption rate of the present disclosure is applied.
Figure 6:
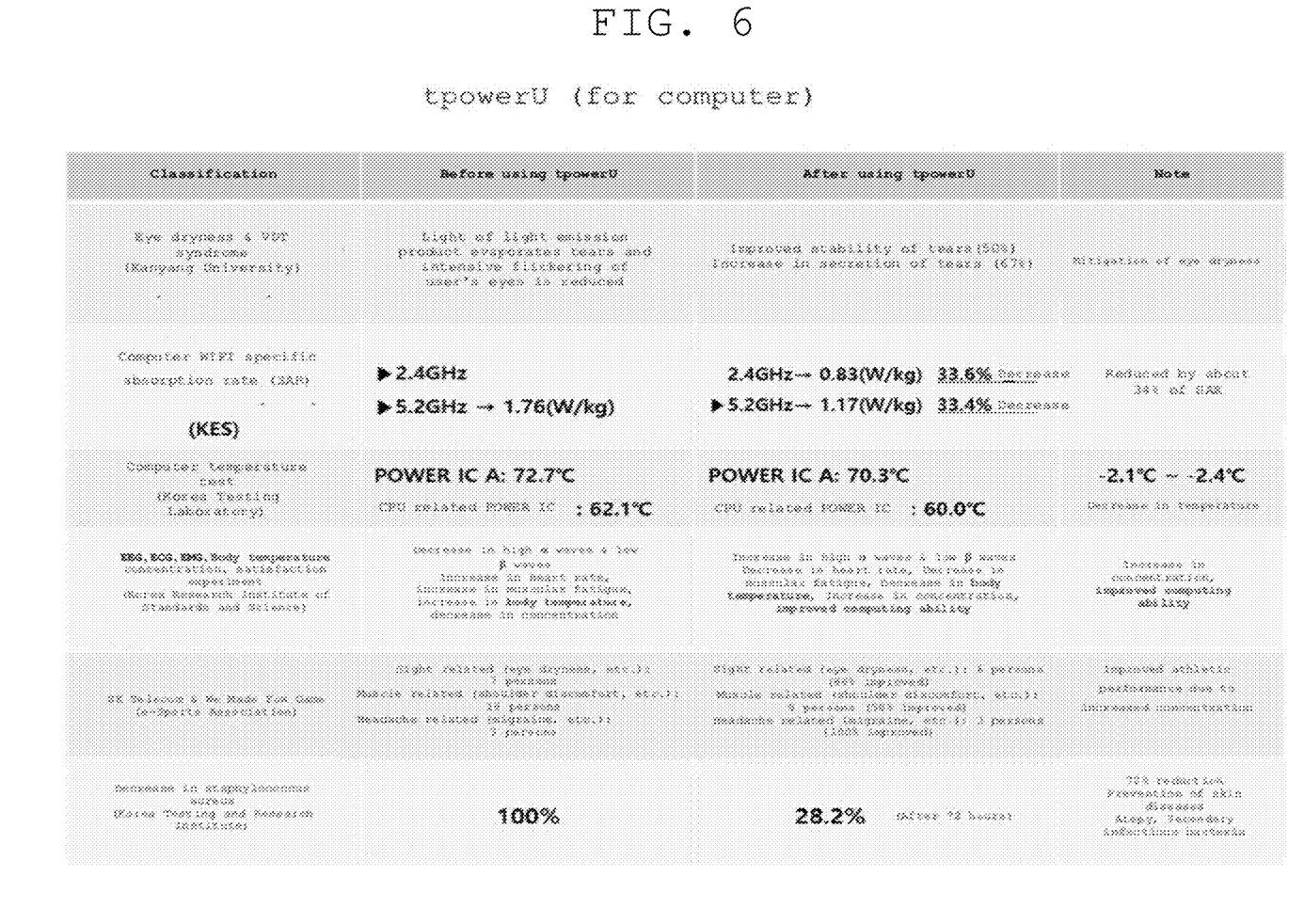

In this regard, the target field circuit unit applied with the transfer target as a configuration of the present disclosure illustrated in FIG. 4 has been implemented in the USB type of device for reducing the specific absorption rate and the test results were illustrated in Tables illustrated in FIGS. 5 and 6.

FIG. 5 illustrates a test result for a connector type of device for reducing a specific absorption rate applied to a smart phone which is disclosed as Beetamin™ (for smart phone) and FIG. 6 illustrates a test result for a USB type of device for reducing a specific absorption rate applied to a PC and a notebook as disclosed as tpowerU™ (for computer).

In the test results, as seen from comparing before use and after use, in the case of the connector type of device for reducing the specific absorption rate applied to the smart phone, there are effects of mitigation and improvement in the electronic wave reduction rate, a stress index, a change in body temperature, a brain wave test, heating of the smart phone, and a subjective fatigue.

Further, even in the case of the USB type of device for reducing the specific absorption rate applied to the PC and the notebook, it can be seen that there is a positive result in relation with eye dryness & VDT syndrome, computer Wi-Fi specific absorption rate (SAR), computer temperature test, ECG, EMG, body temperature, computing ability test, sight/muscle/headache improvements, and a decrease in *Staphylococcus aureus*.

Hereinabove, the embodiments of the present disclosure have been described with the accompanying drawings, but it can be understood by those skilled in the art that technical configurations of the present disclosure can be executed in other detailed forms without changing the technical spirit or requisite features of the present disclosure. Therefore, it should be appreciated that the aforementioned embodiments are illustrative in all aspects and are not restricted. In addition, the scope of the present disclosure is indicated by the appended claims to be described below rather than the detailed description above. Further, it is to be understood that all changes or modifications derived from the meaning and scope of the appended claims and equivalent concepts thereof are included in the scope of the present disclosure.

What is claimed is:

1. A system for reducing a specific absorption rate, the system comprising:
    a source field generation unit wound with a first cylindrical coil and accommodating a source material therein, and generating a source field by applying a periodic input signal to the first cylindrical coil;
    a physical property change unit wound with a second cylindrical coil disposed adjacent to the first cylindrical coil and accommodating a transfer target therein, and changing a physical property of the transfer target based on the generated source field; and
    a target field circuit unit controlling the transfer target to form a target field by a PCB substrate with a power supply interface connected to a power supply and an input of the power supply.

2. The system of claim 1, wherein the source field generation unit further includes a flat type first spiral coil disposed on a side surface of the first cylindrical coil,
    wherein the physical property change unit further includes a flat type second spiral coil disposed on a side surface of the second cylindrical coil, and
    wherein the flat type first and second spiral coils are inter-connected.

3. The system of claim 1, wherein the source material is a crystalline material and the transfer target is a thin-film type metal.

4. The system of claim 1, wherein the source field is a longitudinal wave.

5. The system of claim 1, further comprising:
    a frequency generator for generating the periodic input signal, wherein the periodic input signal is a frequency which matches a unique frequency of the source material.

* * * * *